(12) United States Patent
Illek et al.

(10) Patent No.: US 9,583,467 B2
(45) Date of Patent: Feb. 28, 2017

(54) OPTOELECTRONIC SEMICONDUCTOR COMPONENT AND METHOD FOR PRODUCING SAID COMPONENT

(71) Applicant: OSRAM Opto Semiconductors GmbH, Regensburg (DE)

(72) Inventors: Stefan Illek, Donaustauf (DE); Thomas Schwarz, Regensburg (DE); Jürgen Moosburger, Lappersdorf (DE); Walter Wegleiter, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/430,215

(22) PCT Filed: Sep. 6, 2013

(86) PCT No.: PCT/EP2013/068487
§ 371 (c)(1),
(2) Date: Mar. 21, 2015

(87) PCT Pub. No.: WO2014/048699
PCT Pub. Date: Apr. 3, 2014

(65) Prior Publication Data
US 2015/0249070 A1 Sep. 3, 2015

(30) Foreign Application Priority Data
Sep. 25, 2012 (DE) .................... 10 2012 109 028

(51) Int. Cl.
*H01L 25/075* (2006.01)
*H01L 33/50* (2010.01)
(Continued)

(52) U.S. Cl.
CPC ........ *H01L 25/0753* (2013.01); *H01L 33/505* (2013.01); *H01L 33/62* (2013.01);
(Continued)

(58) Field of Classification Search
None
See application file for complete search history.

(56) References Cited

U.S. PATENT DOCUMENTS 6,310,364 B1  10/2001  Uemura
6,396,082 B1   5/2002  Fukasawa et al.
(Continued)

FOREIGN PATENT DOCUMENTS

CN   1319259 A   10/2001
CN   1478306 A    2/2004
(Continued)

*Primary Examiner* — Alexander Ghyka
(74) *Attorney, Agent, or Firm* — Slater Matsil, LLP

(57) ABSTRACT

An optoelectronic semiconductor component and a method for making an optoelectronic semiconductor component are disclosed. In an embodiment the component includes a carrier including at least one conversion-medium body and a potting body, the potting body surrounding the conversion-medium body at least in places, as seen in plan view, electrical contact structures fitted at least indirectly to the carrier and a plurality of optoelectronic semiconductor chips fitted to a main face of the carrier, the optoelectronic semiconductor chips configured to generate radiation, wherein the conversion-medium body is shaped as a plate, wherein the semiconductor chips are directly mechanically connected to the conversion-medium body, and wherein the conversion-medium body is free of cutouts for the electrical contact structures and is not penetrated by the electrical contact structure.

12 Claims, 5 Drawing Sheets

(51) Int. Cl.
  *H01L 33/62* (2010.01)
  *H01L 33/52* (2010.01)
  *H01L 33/64* (2010.01)

(52) U.S. Cl.
  CPC ............ *H01L 33/52* (2013.01); *H01L 33/644* (2013.01); *H01L 2924/0002* (2013.01); *H01L 2933/005* (2013.01); *H01L 2933/0033* (2013.01); *H01L 2933/0041* (2013.01); *H01L 2933/0066* (2013.01); *H01L 2933/0075* (2013.01)

(56) References Cited

U.S. PATENT DOCUMENTS

| | | | |
|---|---|---|---|
| 7,015,514 | B2 | 3/2006 | Baur et al. |
| 2004/0051109 | A1 | 3/2004 | Ishizaki et al. |
| 2006/0138621 | A1 | 6/2006 | Bogner et al. |
| 2006/0251360 | A1* | 11/2006 | Lu ..................... G02B 6/4232 385/88 |
| 2009/0072256 | A1 | 3/2009 | Park et al. |
| 2010/0177519 | A1 | 7/2010 | Schlitz |
| 2010/0230697 | A1* | 9/2010 | Kohler ................. H01L 33/483 257/98 |
| 2011/0260205 | A1 | 10/2011 | Moosburger et al. |
| 2012/0138974 | A1 | 6/2012 | Yoo et al. |
| 2013/0187192 | A1 | 7/2013 | Hoeppel |

FOREIGN PATENT DOCUMENTS

| | | |
|---|---|---|
| CN | 1685530 A | 10/2005 |
| EP | 1349217 A1 | 10/2003 |
| EP | 2461380 A2 | 6/2012 |
| JP | 2002289925 A | 10/2002 |
| WO | 02056390 A1 | 7/2002 |
| WO | 2006087651 A2 | 8/2006 |
| WO | 2012000725 A1 | 1/2012 |

* cited by examiner

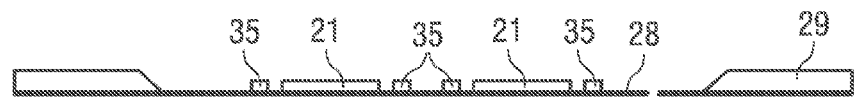
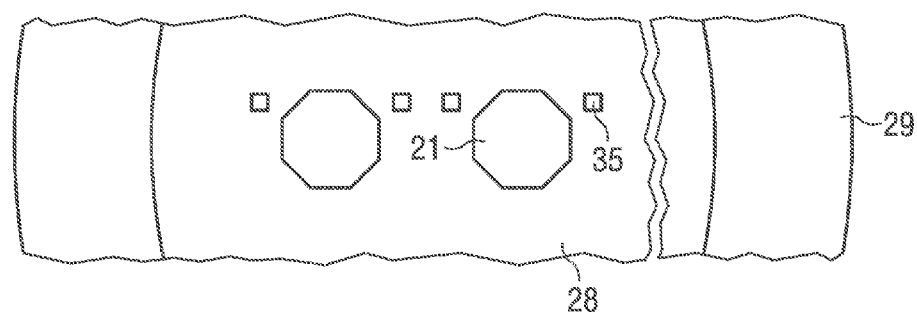
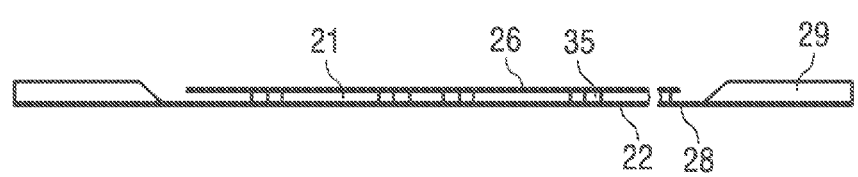
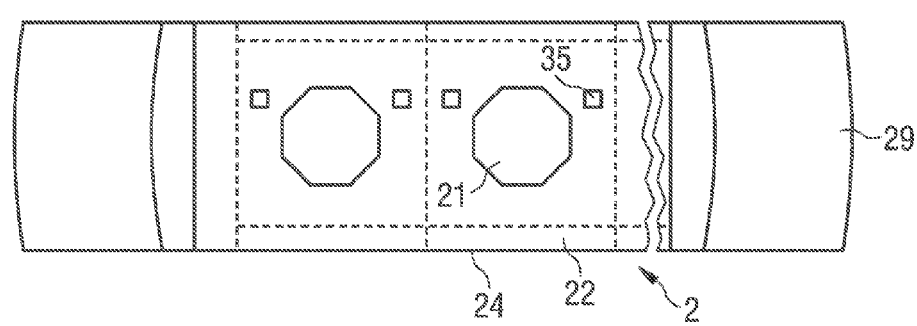
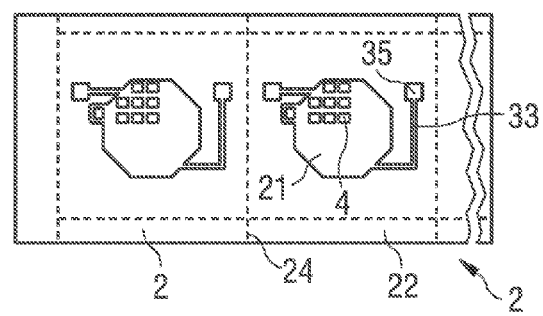

OPTOELECTRONIC SEMICONDUCTOR COMPONENT AND METHOD FOR PRODUCING SAID COMPONENT

This patent application is a national phase filing under section 371 of PCT/EP2013/068487, filed Sep. 6, 2013, which claims the priority of German patent application 10 2012 109 028.9, filed Sep. 25, 2012, each of which is incorporated herein by reference in its entirety.

TECHNICAL FIELD

An optoelectronic semiconductor component is specified. Furthermore, a method for producing such a semiconductor component is specified.

SUMMARY OF THE INVENTION

In accordance with at least one embodiment, the optoelectronic semiconductor component comprises a carrier. The carrier comprises at least one conversion-medium body and a potting body. The conversion-medium body comprises one or a plurality of phosphors. The at least one phosphor is designed at least partly to absorb a primary radiation and to convert it into a longer-wavelength secondary radiation.

In accordance with at least one embodiment, the potting body is shaped onto the conversion-medium body in a positively locking manner in places, in particular by means of injection or pressing. The potting body is mechanically fixedly and permanently connected to the conversion-medium body. That can mean that the potting body does not become detached from the conversion-medium body during intended use of the semiconductor component.

In accordance with at least one embodiment, the potting body surrounds the conversion-medium body in places or all around, as seen in a plan view of the semiconductor component. The potting body can be shaped as a type of circumferential frame for the conversion-medium body. In particular, the conversion-medium body is mechanically stabilized by the potting body.

In accordance with at least one embodiment of the semiconductor component, electrical contact structures are fitted indirectly or directly to the carrier. Indirectly can mean that the contact structures are spaced apart from the carrier at least in places, but are preferably mechanically fixedly connected to the carrier. Directly means, for example, that the contact structures touch the carrier at least in places. The semiconductor component is electrically connectable via the electrical contact structures and current paths within the semiconductor component are defined by the electrical contact structures.

In accordance with at least one embodiment, the semiconductor component comprises a plurality of optoelectronic semiconductor chips. The semiconductor chips are designed for generating radiation. Preferably, the semiconductor chips are light emitting diode chips. By way of example, the semiconductor chips emit visible light, near infrared radiation or radiation from the near ultraviolet spectral range during the operation of the semiconductor component.

In accordance with at least one embodiment, the semiconductor chips are fitted to the carrier. Preferably, the semiconductor chips are directly mechanically connected to the conversion-medium body. This can mean that only a connection medium such as a solder or an adhesive is situated between the semiconductor chips and the conversion-medium body in particular at electrical contact locations. In other words, the conversion-medium body then serves as a mounting platform for the semiconductor chips and the semiconductor chips are mounted on the conversion-medium body.

In accordance with at least one embodiment, the conversion-medium body is shaped as a plate. This can mean that the conversion-medium body has two mutually opposite main sides shaped in a planar fashion on average within the scope of the production tolerances. Lateral dimensions of the conversion-medium body as seen in plan view, exceed a thickness of the conversion-medium body in particular by at least a factor of 10 or by at least a factor of 50 or by at least a factor of 200. The fact that the two main sides are shaped in a planar fashion on average does not exclude a roughening being formed in at least one of the main sides for instance for the purpose of improving coupling-out of radiation or for the purpose of improving adhesion properties.

In accordance with at least one embodiment, the conversion-medium body extends continuously over a plurality of the semiconductor chips or over all the semiconductor chips of the semiconductor component. In particular, the semiconductor component comprises exactly one conversion-medium body, on which all the semiconductor chips are fitted.

In accordance with at least one embodiment, the conversion-medium body laterally projects beyond the semiconductor chips. That is to say that, as seen in plan view, the conversion-medium body projects beyond at least a portion of the semiconductor chips or beyond all the semiconductor chips.

In accordance with at least one embodiment, the conversion-medium body is free of cutouts for the electrical contact structures. Furthermore, the conversion-medium body is preferably not penetrated by the electrical contact structures. It is therefore possible for the conversion-medium body to be shaped as a continuous plate without openings and with a substantially constant thickness. As seen in plan view, preferably, in that case none of the contact structures is situated within an enclosing line of the conversion-medium body and between the two main sides of the conversion-medium body. Consequently, the conversion-medium body has no internal structure designed for electrically contacting the semiconductor chips and/or the semiconductor component.

In at least one embodiment, the optoelectronic semiconductor component comprises a carrier comprising at least one conversion-medium body and comprising at least one potting body. The potting body surrounds the conversion-medium body at least in places, as seen in plan view. Electrical contact structures are fitted to the carrier. Likewise, a plurality of optoelectronic semiconductor chips are fitted to the carrier. The semiconductor chips are designed for generating radiation. The conversion-medium body is shaped as a plate. The conversion-medium body preferably extends continuously over a plurality of the semiconductor chips and preferably projects beyond the semiconductor chips, as seen in plan view. The semiconductor chips are mechanically directly connected to the conversion-medium body. The conversion-medium body is free of cutouts for the electrical contact structures and is not penetrated by the electrical contact structures.

In conventional arrangements comprising a plurality of semiconductor chips, the latter are applied on a system carrier, for instance a metal-core circuit board or a printed circuit board, and are electrically wired and/or electrically interconnected on said system carrier. For generating white light with the aid of light emitting diode chips, conversion substances are often used, in particular for general lighting purposes. To that end, individual conversion laminae, for instance, are applied to the light emitting diode chips that have been mounted on the system carrier and already electrically interconnected. Such system carriers, in particular metal-core circuit boards, are comparatively cost-intensive, however, and placement of conversion lamina onto the semiconductor chips with an accurate fit increases the production outlay.

In the case of the optoelectronic semiconductor component specified, the conversion-medium body itself serves as a mounting plane for semiconductor chips. In particular, the carrier with the one or the plurality of conversion-medium bodies can be embodied as an artificial wafer. The wiring at or on the carrier can thus be effected independently of the production size of the conversion-medium body in a cost-effective batch process. The carrier can be populated with the semiconductor chips by means of a conventional populating process.

In the case of such an optoelectronic semiconductor component, a metal-core circuit board can be dispensed with if more cost-effective, in particular planarizing, electroplating processes are used for producing a heat sink. The use of a continuous conversion-medium body instead of individual conversion lamina reduces a production outlay. A low thermal resistance between the conversion-medium body and the semiconductor chips can be obtained, and hence improved cooling. Furthermore, the semiconductor chips are additionally mechanically stabilized by the conversion-medium body. A homogeneous luminous area can also be achieved by means of the continuous conversion-medium body.

In accordance with at least one embodiment, the carrier constitutes the component part which mechanically carries and supports the semiconductor component. The carrier is then mechanically self-supporting. Without the carrier, the semiconductor component is then mechanically unstable and/or non-self-supporting.

In accordance with at least one embodiment, adjacent semiconductor chips are at a distance or average distance from one another of at most 400 μm or of at most 300 μm or of at most 200 μm or of at most 150 μm. Alternatively or additionally, said distance is at least 20 μm or at least 30 μm or at least 50 μm.

In accordance with at least one embodiment, the electrical contact structures are formed as conductor tracks at least at a side of the carrier which faces away from a radiation main side. The conductor tracks are designed for energizing the individual semiconductor chips. By way of example, the semiconductor chips are electrically connected in series or electrically connected in parallel by means of the conductor tracks. It is possible for groups of semiconductor chips or individual semiconductor chips to be electrically drivable independently of one another by means of the conductor tracks.

In accordance with at least one embodiment, the conductor tracks are situated in a plane between the carrier and the semiconductor chips. In particular, the conductor tracks are then shaped at a side of the carrier which faces the semiconductor chips. The conductor tracks can be directly connected to the potting body and/or the conversion-medium body at least in places and can touch the conversion-medium body and/or the potting body at least in places.

In accordance with at least one embodiment, the semiconductor chips have electrical contact locations. The electrical contact locations are formed, for example, by metallizations at the semiconductor chips. The electrical contact locations of the semiconductor chips can be situated at one side or at both sides of the semiconductor chips. All the electrical contact locations of the semiconductor chips can face the carrier or else face away from the carrier and be spaced apart from the carrier, in particular the conversion-medium body.

In accordance with at least one embodiment, the conductor tracks for energizing the individual semiconductor chips are situated in a plane at a side of the semiconductor chips which faces away from the carrier. In other words, the semiconductor chips are then situated between the plane with the conductor tracks and the carrier.

In accordance with at least one embodiment, a mirror is situated at least in places between the electrical contact structures, in particular the conductor tracks, and the conversion-medium body. The mirror is, for example, a metallic mirror comprising or composed of a silver layer. The mirror can be segmented and can be restricted to regions with the conductor tracks, as seen in plan view.

In accordance with at least one embodiment, the semiconductor chips are arranged in a matrix-like fashion within one or a plurality of arrays. Preferably, the semiconductor chips are arranged densely within the array. Densely can mean that in said array the semiconductor chips make up an area proportion, as seen in plan view, of at least 25% or of at least 50% or of at least 65%.

In accordance with at least one embodiment, the conversion-medium body extends over the entire array. In particular, exactly one conversion-medium body is provided per array.

In accordance with at least one embodiment, as seen in plan view, the potting body has in regions alongside the array with the semiconductor chips a deviating thickness, relative to the thickness of the conversion-medium body or relative to the thickness of the potting body directly at the conversion-medium body. In particular, the thickness of the potting body in regions alongside the array is greater than at or in the array or than the thickness of the conversion-medium body.

In accordance with at least one embodiment, the potting body, in the region alongside the array with the semiconductor chips, has two or more than two electrical plated-through holes. The plated-through holes penetrate through the potting body preferably completely. The plated-through holes are electrically conductively connected to the conductor tracks. Furthermore, the plated-through holes are preferably connected to electrical contact locations for externally contacting the semiconductor component or are shaped as such contact locations.

In accordance with at least one embodiment, the semiconductor component is designed to be electrically connected at the radiation main side of the carrier facing away from the semiconductor chips. Thermal contacting of the semiconductor component is effected in particular via a rear side situated opposite the radiation main side.

In accordance with at least one embodiment, a heat sink is fitted at a side of the semiconductor chips which faces away from the carrier. By way of example, the heat reduction is formed by a electroplating. The rear side of the semiconductor component can be a side of the heat sink which faces away from the semiconductor chips.

In accordance with at least one embodiment, the heat sink extends continuously and in an uninterrupted manner over all the semiconductor chips. It is possible for the heat sink to be shaped onto the semiconductor chips in a positively locking manner and to reproduce a contour of the semiconductor chips or a contour of a protection layer fitted on the semiconductor chips.

In accordance with at least one embodiment, the heat sink is segmented. Individual segments of the heat sink are preferably assigned in each case to one or a plurality of the semiconductor chips. The segments can be designed for electrically contacting the semiconductor chips.

In accordance with at least one embodiment, the semiconductor component comprises a plurality of the conversion-medium bodies. The different conversion-medium bodies, which can have mutually different material compositions, are mechanically permanently and fixedly connected to one another via the potting body. Each of the conversion-medium bodies can be assigned to a plurality or an array of the semiconductor chips.

In accordance with at least one embodiment, the conversion-medium body is formed by a ceramic plate, into which one or a plurality of phosphors are introduced. As an alternative thereto, it is possible for the conversion-medium body to be formed from one or a plurality of sintered phosphors, for the conversion-medium body to be a monocrystalline converter or a silicone-bonded converter, or for the conversion-medium body to be formed from glass or sapphire into which at least one phosphor is introduced.

Furthermore, a method for producing an optoelectronic semiconductor component is specified. The method is used to produce a semiconductor component as described in association with one or more of the embodiments mentioned above. Therefore, features of the semiconductor component are also disclosed for the method, and vice versa.

In at least one embodiment, the method comprises at least the following steps: A) providing the at least one conversion-medium body, B) shaping the potting body around the conversion-medium body, C) fitting the individual semiconductor chips to the conversion-medium body, D) shaping at least one filling around the semiconductor chips, and E) shaping the heat sink at that side of the semiconductor chips which faces away from the carrier by material deposition, in particular by electroplating.

In this case, the individual method steps are preferably carried out in the stated order.

In accordance with at least one embodiment, the method comprises the step of fitting electrical contact structures, in particular the conductor tracks, to the carrier. This step is preferably carried out either between steps B) and C) or between steps C) and D).

In accordance with at least one embodiment, the step of fitting the individual semiconductor chips comprises pressing the semiconductor chips onto the conversion-medium body. A mechanical connection between the semiconductor chips and the conversion-medium body is produced in particular by a filling that serves as a connection medium. The filling can be a so-called underfill. In the case of an underfill, after the semiconductor chips have been mounted, a material of the underfill is fitted, which fills in gaps between the semiconductor chip and the carrier in particular by means of capillary action. A distance between the semiconductor chips and the carrier or between the semiconductor chips and the conductor tracks is preferably at most 10 µm or at most 5 µm or at most 3 µm. It is possible for the filling not to be restricted to a region between the semiconductor chips and the carrier, but rather also to accumulate partly laterally alongside the semiconductor chips, as seen in plan view. Exactly one filling, more than one filling or a multi-component filling can be used. The filling, in particular in the form of an underfill, is preferably radiation-transmissive.

BRIEF DESCRIPTION OF THE DRAWINGS

An optoelectronic semiconductor component described here and a method described here are explained in greater detail below on the basis of exemplary embodiments with reference to the drawing. In this case, identical reference signs indicate identical elements in the individual figures. In this case, however, relations to scale are not illustrated; rather, individual elements may be illustrated with an exaggerated size in order to afford a better understanding.

In the figures:

FIGS. 6A to 6E, show schematic illustrations of production methods for optoelectronic semiconductor components described here in sectional illustrations and plan views, and FIG. 2, collectively FIGS. 2A to 2C, FIG. 3, collectively FIGS. 3A to 3B, FIG. 4, collectively FIGS. 4A to 4B, and FIG. 5, collectively

DETAILED DESCRIPTION OF ILLUSTRATIVE EMBODIMENTS

FIGS. 1A to 1F illustrate a method for producing an optoelectronic semiconductor component 1.

Figure 1A:
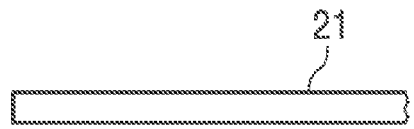
FIG. 1, collectively FIGS. 1A to 1G, and FIG. 6, collectively

In accordance with FIG. 1A, a conversion-medium body 21 is provided. The conversion-medium body 21 is shaped as a plate and has two planar main sides oriented parallel to one another. A thickness of the conversion-medium body 21 is constant across the entire lateral extent, in particular with a tolerance of at most 15% or of at most 5%, relative to an average thickness. In contrast to the illustration shown, the conversion-medium body 21 can have roughenings or structurings at the main sides.

Figure 1B:

FIG. 1B illustrates that a potting body 22 is shaped onto the conversion-medium body 21 and a carrier 2 is thus formed. The carrier 2 is, in particular, a so-called artificial wafer. At an interface between the conversion-medium body 21 and the potting body 22, they can terminate flush with one another and have identical thicknesses. In contrast to the depiction shown, the potting body 22 can also cover main sides of the conversion-medium body 21 in places and have a thickness deviating from that of the conversion-medium body 21.

Figure 1C:
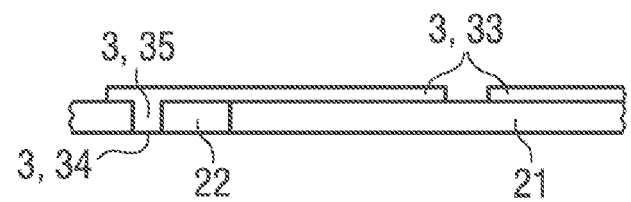

In the method step in accordance with FIG. 1C, electrical contact structures 3 in the form of conductor tracks 33 are fitted to one of the main sides of the carrier 2. The conductor tracks 33 are metallizations, for example. Preferably, the conductor tracks 33 cover only a small proportion of the area of the conversion-medium body 21, as seen in plan view.

Optionally, at least one plated-through hole 35 is shaped through the potting body 22 and can also be used for shaping an electrical contact location 34 for externally contacting the semiconductor component. In contrast to the illustration shown, a cutout for the plated-through hole 35 is preferably already created in the method step in accordance with FIG. 1B. The plated-through hole 35 can be a piece of metal embedded into the potting body 22 during the process of creating the latter.

Figure 1D:
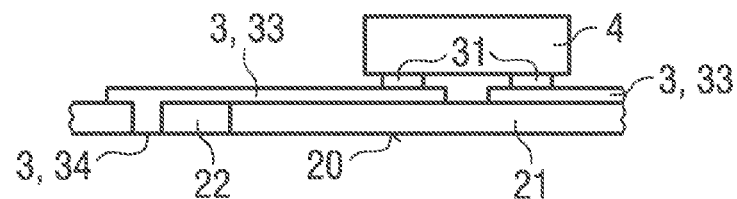

FIG. 1D shows that an optoelectronic semiconductor chip 4 is applied to the conductor tracks 33 and to the conversion-medium body 21. The semiconductor chip 4 is preferably a light emitting diode chip. An electrical contacting between the conductor tracks 33 and the semiconductor chip 4 is produced by means of an electrical connection medium 31. The connection medium 31 is, for instance, a solder or an electrically conductive adhesive. Just a single semiconductor chip 4 is depicted in order to simplify the illustration.

In contrast to the illustration shown, in addition to the electrical connection medium 31, it is possible to use a further connection medium for mechanically fixing the semiconductor chip 4 to the conversion-medium body 21.

Figure 1E:
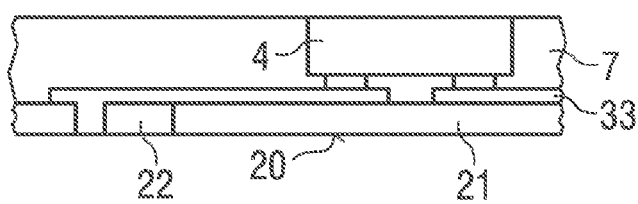

In the method step as illustrated in FIG. 1E, a filling 7 is fitted around the semiconductor chip 4 and on the carrier 2, for example, by means of transfer molding. The filling 7 can terminate flush with the semiconductor chip 4, in a direction away from the carrier 2. The method step in accordance with FIG. 1E is optional here. A covering film, not depicted, can also be used instead of the filling 7.

Optionally, between the method steps in accordance with FIGS. 1D and 1E, a so-called underfill, not depicted, can be fitted. The underfill is preferably radiation-transmissive and transparent. The underfill can be a part of the filling 7 or can be used in addition to the filling 7.

Figure 1F:
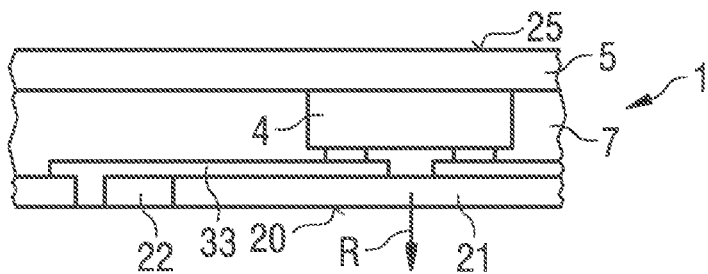

In accordance with FIG. 1F, a heat sink 5 is applied on the semiconductor chip 4, and on the filling 7, for example, by means of electroplating. A rear side 25 of the semiconductor component 1 is formed by the electroplating 5. Optionally, a mirror (not illustrated) is situated between the electroplating 5 and the radiation-transmissive filling 7. The plating 5 extends continuously over all the semiconductor chips 4, but can also be segmented, in a departure from the illustration.

Radiation generated in the semiconductor component 1 is emitted at that side of the carrier 2 which faces away from the semiconductor chip 4. This side constitutes a radiation main side 20.

Figure 1G:
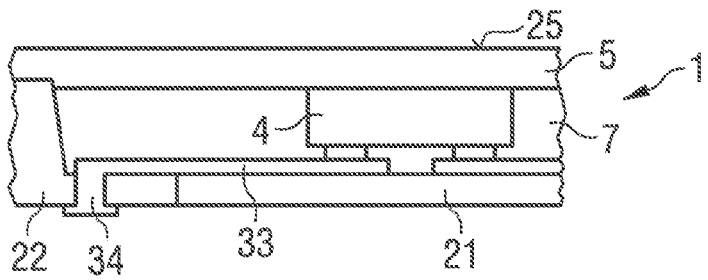

FIG. 1G shows a variant in which the potting body 22 has a greater thickness at an edge region than near to the conversion-medium body 21. In contrast to the illustration shown, the heat sink 5 can extend with constant thickness both across the potting body 22 and across the filling 7. The rear side 25 is preferably shaped in a planar fashion.

The potting body 22 is shaped, for example, from a thermoplastic, a thermosetting plastic, an epoxy, a silicone resin, a silicone composite material, or an epoxy-silicone hybrid material. The potting body 22 can be provided with a fiber reinforcement, with particles, beads and/or grains. The filling 7, which in particular is a molding compound, can comprise fillers and is formed, for example, by an epoxy, a silicone or by a silicone-epoxy hybrid material. Fillers of the filling can bring about a black coloring or a white coloring. Likewise, the filling 7 can be radiation-transmissive, in particular transparent, at least in regions.

Figure 2A:
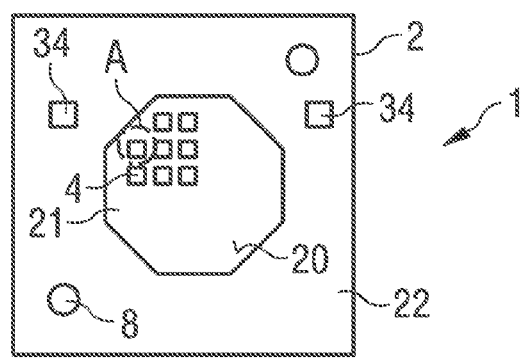
Figure 2B:
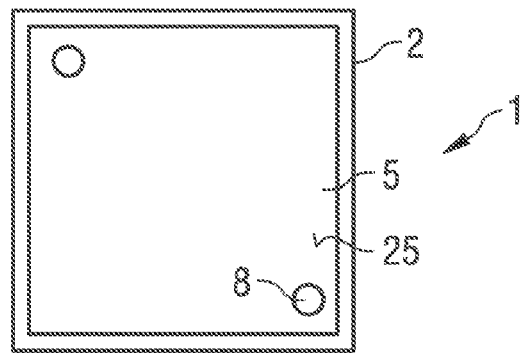
Figure 2C:
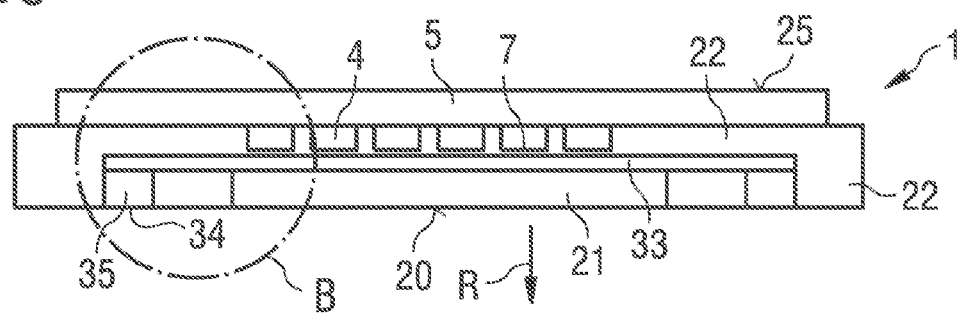

FIG. 2 illustrates one exemplary embodiment of the semiconductor component 1 in a schematic plan view, see FIG. 2A, in a schematic bottom view, see FIG. 2B, and in a schematic sectional illustration, see FIG. 2C.

A plurality of the semiconductor chips 4 are arranged densely in an array. The conversion-medium body 21 extends continuously over the entire array. The electrical contact locations 34 are fitted to the radiation main side 20. In order to simplify the illustration, the semiconductor chips 4 are depicted only at part of the radiation main side above the conversion-medium body 21.

Optionally, fixing devices 8 in the form of drilled holes are formed in the potting body 22. The semiconductor component 1 can be mechanically fixed to an external carrier (not illustrated) by means of said fixing devices 8.

Apart from a narrow, circumferential edge, the entire rear side 25 is formed by the heat sink 5, see FIG. 2B. The heat sink 5 is shaped from copper, for example.

In a departure from the illustration, it is possible for the semiconductor component 1 to comprise a plurality of the conversion-medium bodies 21 and for an array of semiconductor chips 4 in each case to be fitted on one of the conversion-medium bodies. The semiconductor chips 4 can all be fashioned structurally identically. As an alternative thereto, it is possible for different types of semiconductor chips 4 to be used, for example, semiconductor chips having different emission wavelengths. The conversion-medium body 21 can optionally have further optical properties; in particular, the conversion-medium body 21 can serve as scattering means.

A main emission direction of radiation R generated in the semiconductor component 1 is preferably oriented perpendicularly to the main radiation main side 20.

Figure 3A:
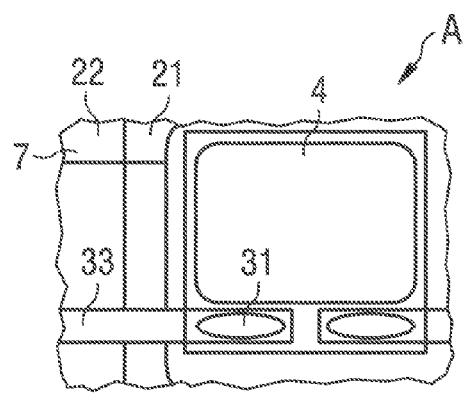
Figure 3B:
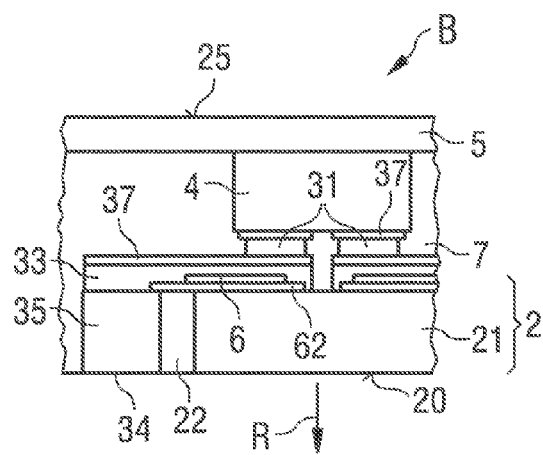
Figure 4A:
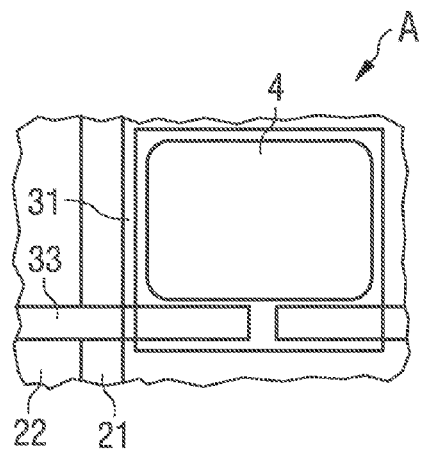
Figure 4B:
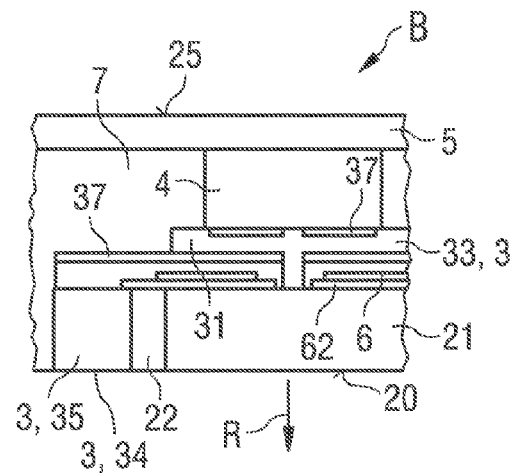

FIGS. 3 and 4 show detail views of the regions A and B from FIGS. 2A and 2C. The semiconductor chip 4, as used in FIGS. 3 and 4, is constructed, for example, in the manner specified in U.S. Application Publication No. 2011/0260205 A1. The disclosure content of said document is incorporated by reference.

In accordance with FIGS. 3 and 4, metallizations 37 of the semiconductor chips 4 in each case face the carrier 2. The conductor tracks 33 are situated between the semiconductor chips 4 and the carrier 2. The semiconductor chips 4 are optionally embedded in each case into the filling 7. Preferably, the heat sink 5 is fitted in each case directly onto the semiconductor chips 4, wherein the heat sink 5 is electrically insulated from the conductor tracks 33. A mechanical contact between the semiconductor chip 4 and the conversion-medium body 21 can be produced by means of the filling 7, see FIG. 3, in particular. A layer thickness of the filling 7 between the semiconductor chip 4 and the conversion-medium body 21 is preferably as thin as possible.

In FIGS. 3A and 4A, in order to simplify the illustration, the heat sink 5 is not shown and the filling 7 is not shown or only partly shown.

In the exemplary embodiment in accordance with FIG. 3, the electrical connection medium 31 is formed, for example, by a solder or by an electrically conductive adhesive. The connection medium 31 can also be so-called gold-gold interconnects. The connection medium 31 can also be a selectively printed conductive adhesive, in particular based on silver. The filling 7 is preferably a radiation-transmissive, preferably transparent, so-called underfill.

In accordance with FIG. 4, the connection medium 31 is an anisotropic conductive adhesive, or ACA for short. The connection medium 31 is preferably formed as an anisotropic conductive film, or ACF for short. In the case of FIG. 4, the semiconductor chip 4 is mechanically fixed to the conversion-medium body 21 with the aid of the electrical connection medium 31.

In accordance with FIG. 4, the connection medium 31 extends across all the semiconductor chips 4 and is situated between the semiconductor chips 4 and the conversion-medium body 21. The connection medium 31 is radiation-transmissive, preferably transparent.

The conductor tracks 33 are preferably formed in each case from copper. Optionally, a metallization 37 is in each case applied at a side of the conductor tracks 33 which faces away from the carrier 2, and likewise at the semiconductor chips 4. The metallization is shaped from titanium, platinum and/or gold, for example.

As also in all the other exemplary embodiments, a mirror 6 is optionally situated at least in places between the conductor tracks 33 and the conversion-medium body 21 and/or the potting body 22. The mirror 6 is a silver mirror, for example. Furthermore, a protection layer 62 is optionally fitted at a side of the silver mirror 6 which faces the carrier 2. The protection layer 62 is shaped from silicon oxide or silicon nitride, for example.

In the case of such a semiconductor component 1, the conversion-medium body 21 is in good thermal contact with the heat sink 5. Since the semiconductor chips 4 are fixed on the conversion-medium body 21, it is possible to realize a small connection medium thickness between the semiconductor chips 4 and the conversion-medium body 21. Better cooling of the conversion-medium body 21 and a higher efficiency of the semiconductor component 1 can be realized as a result. By contrast, if individual conversion-medium bodies, one respectively for one of the semiconductor chips 4, are used, then different connection medium thicknesses can occur and individual conversion laminae can be tilted relative to one another. This can also lead to less uniform colored emission.

A thickness of the heat sink 5, in a direction perpendicular to the radiation main side 20, is, for example, at least 0.1 µm or at least 5 µm or at least 10 µm or at least 20 µm. Alternatively or additionally, the thickness of the heat sink 5 is at most 500 µm or at most 300 µm or at most 150 µm.

One of the arrays of the semiconductor chips comprises, for example, at least four or at least nine or at least 16 or at least 25 of the semiconductor chips. The semiconductor component 1 correspondingly comprises at least such a number of semiconductor chips 4. The semiconductor chips 4 are preferably arranged regularly and in a matrix-like fashion within the array, although arrangements deviating therefrom are likewise possible.

The semiconductor chips 4 preferably have an electrically insulating substrate, not depicted. A semiconductor layer sequence of the semiconductor chips 4, likewise not depicted, preferably faces the carrier 2. If the semiconductor chips 4 have an electrically conductive substrate, then an electrically insulating layer (not depicted) is preferably situated at a side of the semiconductor chips 4 which faces the heat sink 5.

Figure 5A:
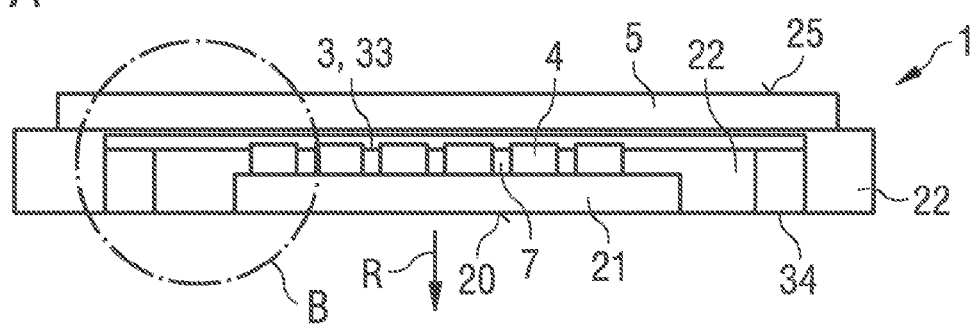
FIGS. 5A to 5B, show schematic sectional illustrations and plan views of exemplary embodiments of optoelectronic semiconductor components described here.
Figure 5B:
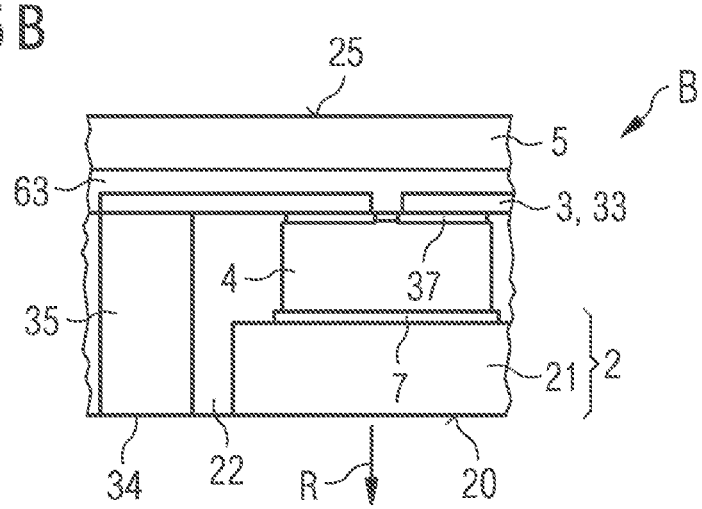

A further exemplary embodiment of the semiconductor component 1 is illustrated in FIG. 5, see the sectional illustration in FIG. 5A and the detail view B in FIG. 5B. The plan views and bottom views are analogous to FIGS. 2A and 2B.

The conductor tracks 33 are situated at a side of the semiconductor chips 4 which faces away from the carrier 2. Electrical contact locations 37 of the semiconductor chips 4 likewise face away from the carrier 2. By way of example, the semiconductor chips 4 are constructed in the manner specified in International Application Publication No. WO 2012/000725 A1, the disclosure content also being incorporated by reference.

The filling 7 extends in a thin layer between the conversion-medium body 21 and the semiconductor chips 4 and can also be situated at sidewalls of the semiconductor chips 4. The filling 7 is a silicone, for example. It is possible, as also in all of the other exemplary embodiments, for two fillings to be present, in contrast to the illustration shown. In that case a first filling is situated between the semiconductor chips 4 and the carrier 2, and a second filling, applied by means of transfer molding, for example, is situated laterally alongside the semiconductor chips 4. The second filling can comprise particles, such that the second filling is shaped, for example, in a radiation-absorbing or reflective fashion. Likewise, the filling can also be embodied in a transparent fashion.

An electrically insulating layer 63 is situated between the heat sink 5 and the conductor tracks 33. Optionally, a mirror, not depicted, can be situated at a side of the conductor tracks 33 which faces the carrier 2 or at a side of the heat sink 5 which faces the carrier 2.

In the exemplary embodiments in accordance with FIGS. 2 to 5, in each case separate conductor tracks are shaped. As an alternative thereto, it is possible for the heat sink 5 to be structured to form the conductor tracks and for the semiconductor component 1 to be electrically contacted via the rear side 25. Conductor tracks in the heat sink 5 can be separated from one another by an organic or inorganic dielectric. Said conductor tracks can be arranged laterally alongside one another or else one above another.

FIG. 6 shows a production method for the semiconductor component 1, see the sectional illustrations in FIGS. 6A and 6C and the schematic plan views in FIGS. 6B, 6D and 6E.

In accordance with FIGS. 6A and 6B, a plurality of the conversion-medium bodies 21 and metal bodies, so-called posts, for the plated-through holes 35 are applied on a shaping film 28, on which a shaping edge 29 is situated. The potting body 22 is subsequently shaped around the conversion-medium bodies 21 and the plated-through holes 35, see FIGS. 6C and 6D, such that the continuous carriers 2 arise. In this case, a protection film 26, referred to as protection tape, is optionally applied to the conversion-medium bodies 21.

The carriers 2 produced in this way are subsequently removed from the shaping film 28, see FIG. 6E. Afterward, the conductor tracks 33 are fitted directly to the carrier 2, and the semiconductor chips 4 thereto. The optional step of embedding the semiconductor chips 4 into the filling is not depicted in FIG. 6E. In a departure from FIG. 6E, it is also possible to create the conductor tracks 33 indirectly at the carrier 2 after the fitting of the semiconductor chips 4 and after the optional production of the filling.

The individual carriers 2 can subsequently be separated from one another along singulation lines 24, for instance by means of sawing.

The invention described here is not restricted by the description on the basis of the exemplary embodiments. Rather, the invention encompasses any novel feature, and also any combination of features, in particular any combination of features in the patent claims, even if this feature or this combination itself is not explicitly specified in the patent claims or exemplary embodiments.

The invention claimed is:

1. An optoelectronic semiconductor component comprising:
   a carrier comprising at least one conversion-medium body and a potting body, the potting body surrounding the conversion-medium body at least in places;
   electrical contact structures fitted at least indirectly to the carrier;
   a plurality of optoelectronic semiconductor chips fitted to a main face of the carrier, the plurality of optoelectronic semiconductor chips configured to generate radiation; and
   a filling fitted around the semiconductor chips,
   wherein the conversion-medium body is shaped as a plate, wherein the semiconductor chips are directly mechanically connected to the conversion-medium body, wherein the filling terminates flush with the semiconductor chips, in a direction away from the conversion-medium body, wherein the conversion-medium body is free of cutouts for the electrical contact structures and is not penetrated by the electrical contact structures, wherein the electrical contact structures comprise conductor tracks, wherein the conductor tracks are designed for energizing the semiconductor chips, and wherein the conductor tracks are situated in a plane between the carrier and the semiconductor chips.

2. The optoelectronic semiconductor component according to claim 1, wherein an average distance between adjacent semiconductor chips is at most 200 μm, and wherein the conversion-medium body extends continuously over the plurality of optoelectronic semiconductor chips and projects laterally beyond the semiconductor chips.

3. The optoelectronic semiconductor component according to claim 1, wherein electrical contact locations of the semiconductor chips face the carrier.

4. The optoelectronic semiconductor component according to claim 1, wherein electrical contact locations of the semiconductor chips face away from the carrier, and wherein electrical contact locations of the semiconductor chips and the conductor tracks are spaced apart from the conversion-medium body.

5. The optoelectronic semiconductor component according to claim 1, wherein a mirror is situated at least in places between the electrical contact structures and the conversion-medium body.

6. The optoelectronic semiconductor component according to claim 1, wherein the semiconductor chips are arranged in a matrix-like fashion within at least one array and the conversion-medium body extends over the entire array, wherein in regions alongside the array the potting body has a greater thickness than at the conversion-medium body, and wherein a thickness of the conversion-medium body is constant.

7. The optoelectronic semiconductor component according to claim 6, wherein the potting body, in the region alongside the array, is penetrated by at least two electrical plated-through holes, wherein the optoelectronic semiconductor component is designed to be electrically connected at a radiation main side of the carrier facing away from the semiconductor chips.

8. The optoelectronic semiconductor component according to claim 1, wherein a heat sink is fitted to a side of the semiconductor chips which faces away from the carrier.

9. The optoelectronic semiconductor component according to claim 8, wherein the heat sink extends in a positively locking manner and continuously over all of the semiconductor chips.

10. The optoelectronic semiconductor component according to claim 8, wherein the heat sink is segmented, wherein segments of the heat sink are assigned to one or a plurality of the semiconductor chips.

11. The optoelectronic semiconductor component according to claim 1, wherein the conversion-medium body comprises a plurality of the conversion-medium bodies, wherein the conversion-medium bodies are mechanically permanently and fixedly connected to one another via the potting body.

12. The optoelectronic semiconductor component according to claim 1, wherein the conversion-medium body is a ceramic.

* * * * *